(12) United States Patent
Hsu et al.

(10) Patent No.: US 10,895,007 B2
(45) Date of Patent: Jan. 19, 2021

(54) EVAPORATION APPARATUS AND CALIBRATION METHOD THEREOF

(71) Applicant: Industrial Technology Research Institute, Hsinchu (TW)

(72) Inventors: Yu-Lin Hsu, Tainan (TW); Chien-Hung Lin, Changhua County (TW); Kuo-Hsin Huang, Hsinchu County (TW); Chao-Feng Sung, Hsinchu (TW); Chih-Ming Lai, Changhua County (TW); Hung-Yi Chang, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 346 days.

(21) Appl. No.: 15/841,300

(22) Filed: Dec. 14, 2017

(65) Prior Publication Data

US 2019/0127843 A1 May 2, 2019

(30) Foreign Application Priority Data

Oct. 30, 2017 (TW) .............................. 106137312 A

(51) Int. Cl.
*B05C 19/04* (2006.01)
*C23C 14/54* (2006.01)
*C23C 14/24* (2006.01)

(52) U.S. Cl.
CPC ............ *C23C 14/544* (2013.01); *C23C 14/24* (2013.01); *C23C 14/546* (2013.01)

(58) Field of Classification Search
CPC ..................................................... B05C 19/04
See application file for complete search history.

(56) References Cited

U.S. PATENT DOCUMENTS

| 6,849,832 | B2 | 2/2005 | Endo et al. |
| 9,176,089 | B2 | 11/2015 | Le Neel et al. |
| 9,328,961 | B2 | 5/2016 | Zou et al. |
| 2014/0199500 | A1* | 7/2014 | van Kessel ............ B05C 19/04 427/569 |
| 2014/0291677 | A1 | 10/2014 | Le Neel et al. |

(Continued)

FOREIGN PATENT DOCUMENTS

| CN | 102232180 | 11/2011 |
| CN | 102465276 | 5/2012 |
| CN | 103305797 | 9/2013 |

(Continued)

OTHER PUBLICATIONS

"Office Action of Taiwan Counterpart Application", dated Nov. 26, 2018, p. 1-p. 5.

(Continued)

*Primary Examiner* — Robert M Kunemund
(74) *Attorney, Agent, or Firm* — JCIPRNET

(57) ABSTRACT

An evaporation apparatus including a material source, a chamber, a passageway, and a heating component is provided. The material source is configured to provide a deposition material. The chamber includes a manifold. The passageway is configured to be connected to the material source and the manifold. The heating component is disposed in at least a portion of the passageway and configured to heat the deposition material. A calibration method of the evaporation apparatus is also provided.

18 Claims, 8 Drawing Sheets

(56) References Cited

U.S. PATENT DOCUMENTS

2015/0354896 A1    12/2015    Zhang

FOREIGN PATENT DOCUMENTS

| CN | 106967951 | 7/2017 |
| CN | 106978590 | 7/2017 |
| TW | 201446991 | 12/2014 |
| TW | I534292 | 5/2016 |

OTHER PUBLICATIONS

"Office Action of China Counterpart Application", dated Jul. 30, 2020, pp. 1-12.

* cited by examiner

EVAPORATION APPARATUS AND CALIBRATION METHOD THEREOF

CROSS-REFERENCE TO RELATED APPLICATION

This application claims the priority benefit of Taiwan application serial no. 106137312, filed on Oct. 30, 2017. The entirety of the above-mentioned patent application is hereby incorporated by reference herein and made a part of this specification.

TECHNICAL FIELD

The disclosure relates to an evaporation apparatus and a calibration method thereof.

BACKGROUND

The evaporation process is an extensively applied thin film deposition technique. Existing evaporation equipment includes an evaporation chamber, a carrying apparatus disposed in the evaporation chamber, and an evaporation source opposite to the carrying apparatus. The evaporation source can carry an evaporation material. During the evaporation process, the evaporation material is volatilized or sublimed by heating and filled in the evaporation chamber in the form of evaporation particles. At the same time, when an object to be coated is placed on the carrying apparatus, the evaporation particles filled in the evaporation chamber can be accumulated on the surface of the object to be coated to form an evaporation coating.

The thickness of the evaporation coating can be adjusted by adjusting various parameters of the evaporation process. The parameters can include, for instance, evaporation rate, evaporation time, distance between the object to be coated and the evaporation source, and temperature to which the evaporation source is heated. In particular, the accuracy and stability of the evaporation rate are very important for the quality of the coating.

SUMMARY

The evaporation apparatus of an embodiment of the disclosure includes a material source, a chamber, a passageway, and a heating component. The material source is configured to provide a deposition material. The chamber includes a manifold. The passageway is configured to be connected to the material source and the manifold. The heating component is disposed in at least a portion of the passageway and configured to heat the deposition material.

The calibration method of the evaporation apparatus of an embodiment of the disclosure includes the following steps. The evaporation apparatus is provided, wherein the evaporation apparatus further includes a quartz crystal microbalance, a valve, and a pressure sensor. The rate of change of the deposition rate of the deposition material and the rate of change of the opening and closing rate of the valve detected by the quartz crystal microbalance are respectively limited within a selected range. The passageway is heated via the heating component such that the rate of change of the deposition rate of the deposition material detected by the pressure sensor is within an expected range.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
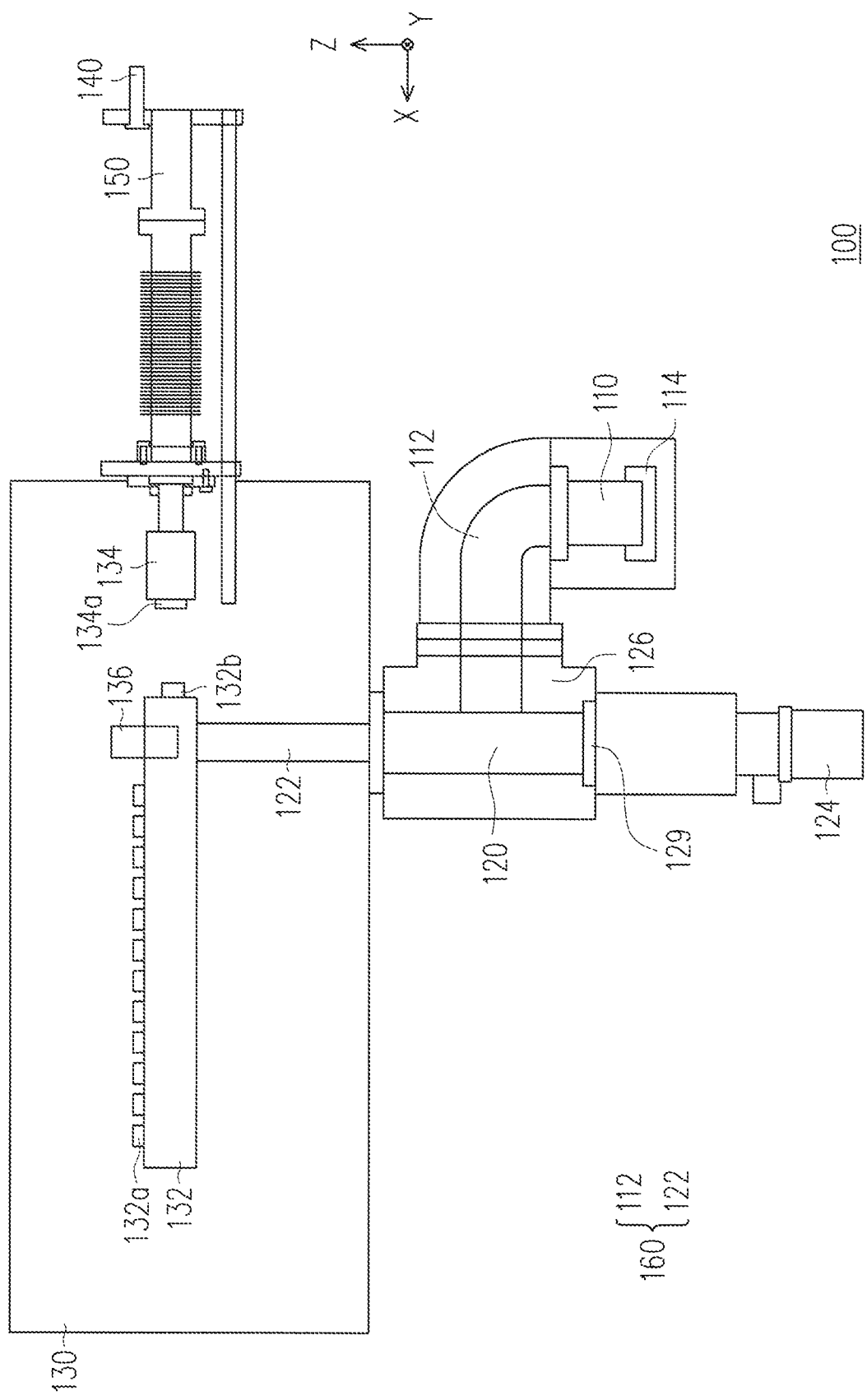
FIG. 1 is a schematic of an evaporation apparatus according to an embodiment of the disclosure.
Figure 2:
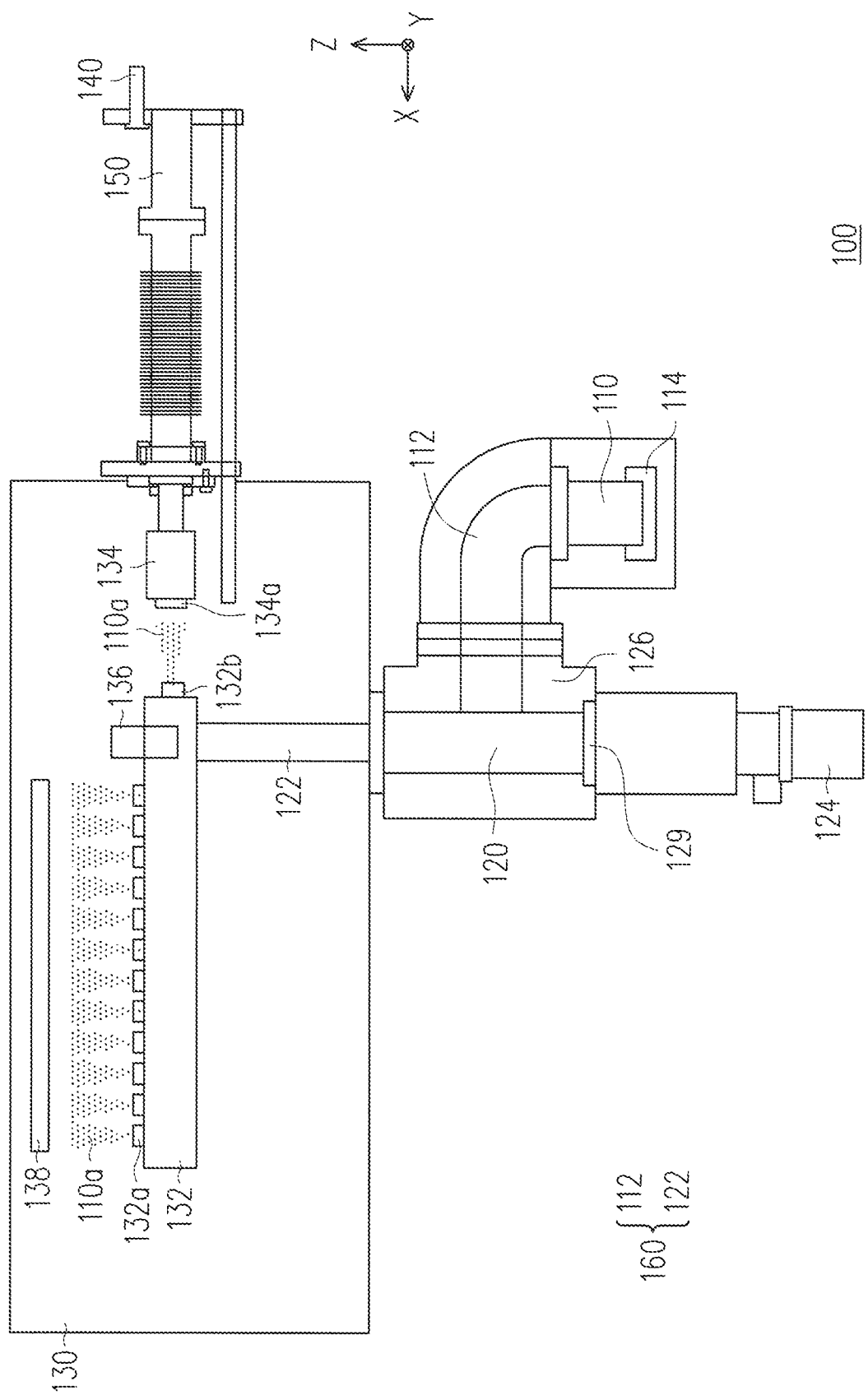
FIG. 2 is a schematic of an evaporation process performed by the evaporation apparatus of FIG. 1.
Figure 3A:
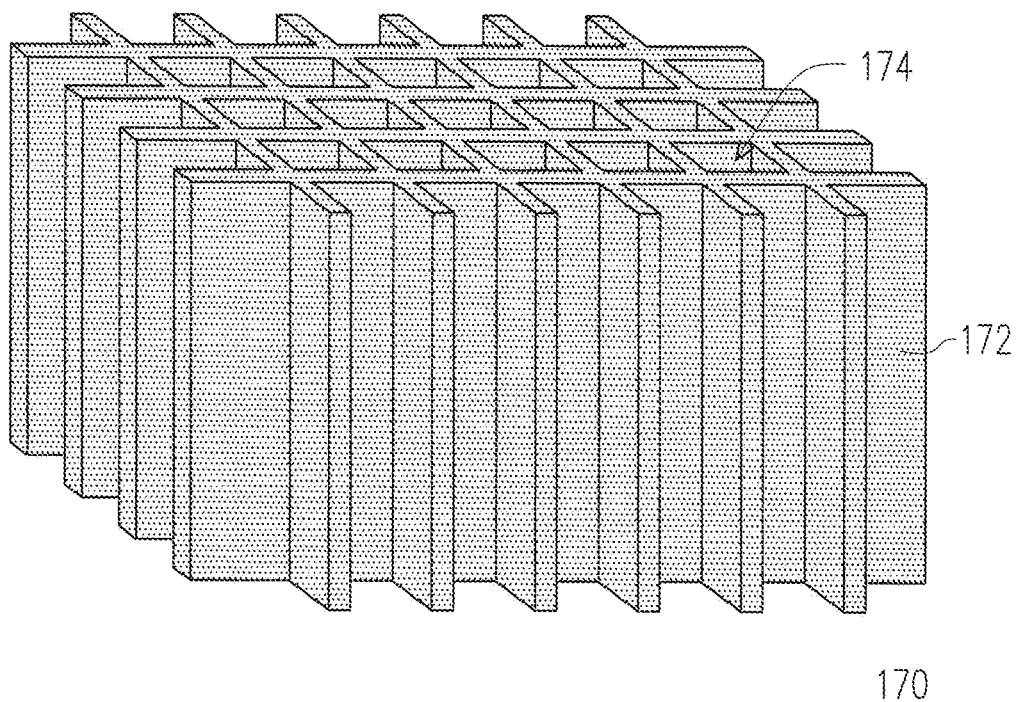
FIG. 3A and FIG. 3B are a 3D view and a top view of a heating component in an evaporation apparatus according to an embodiment of the disclosure.
Figure 3B:
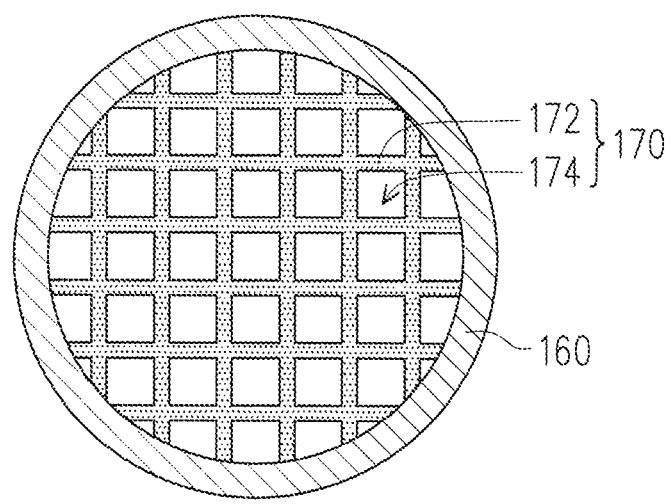

FIG. 1 is a schematic of an evaporation apparatus according to an embodiment of the disclosure. FIG. 2 is a schematic of an evaporation process performed by the evaporation apparatus of FIG. 1. FIG. 3A and FIG. 3B are a 3D view and a top view of a heating component in an evaporation apparatus according to an embodiment of the disclosure. Referring to all of FIG. 1, FIG. 2, FIG. 3A, and FIG. 3B, an evaporation apparatus 100 includes a material source 110, a chamber 130, a passageway 160, and a heating component 170. The material source 110 is configured to provide a deposition material 110a (shown in FIG. 2). The deposition material 110a is suitable to be located in the material source 110. In the present embodiment, the deposition material 110a is any material to be deposited by the user. In other words, the deposition material 110a can be an organic material or an inorganic material. In the present embodiment, the material source 110 is, for instance, a crucible suitable to be heated to vaporize the deposition material 110a. In the present embodiment, the evaporation apparatus 100 further includes, for instance, a heater 114 adjacent to the material source 110 and configured to heat the material source 110. In FIG. 1, the heater 114 surrounds the material source 110 as an example, but the disclosure is not limited thereto.

The passageway 160 is configured to be connected to the material source 110 and the manifold 132 in the chamber 130, and the vaporized deposition material 110a is, for instance, suitable for passing through the passageway 160 and enter the manifold 132 via the material source 110. In the present embodiment, the evaporation apparatus 100 further includes, for instance, a valve 120. The valve 120 is disposed between the material source 110 and the chamber 130 and connected to the material source 110. The passageway 160 includes, for instance, an L-shaped tube 112 and a transfer tube 122, wherein the L-shaped tube 112 is connected to the material source 110 and the valve 120, and the transfer tube 122 is connected to the valve 120 and the manifold 132 of the chamber 130. As a result, the vaporized deposition material 110a is controlled into the chamber 130 by opening or closing the valve 120.

Figure 4A:
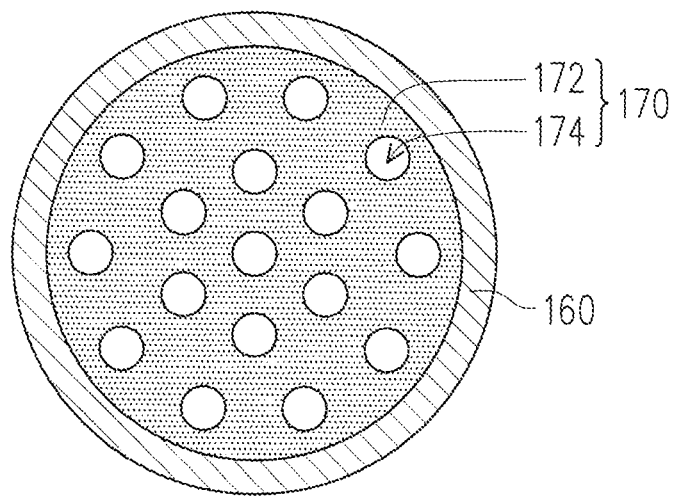
FIG. 4A to FIG. 4C are respectively top views of a heating component in an evaporation apparatus according to an embodiment of the disclosure.
Figure 4B:
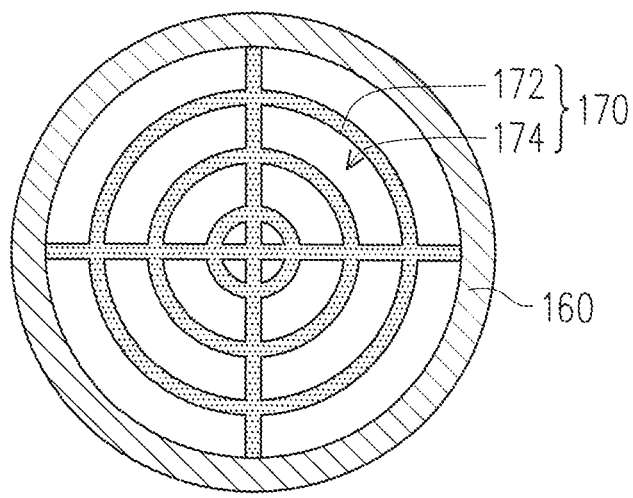
Figure 4C:
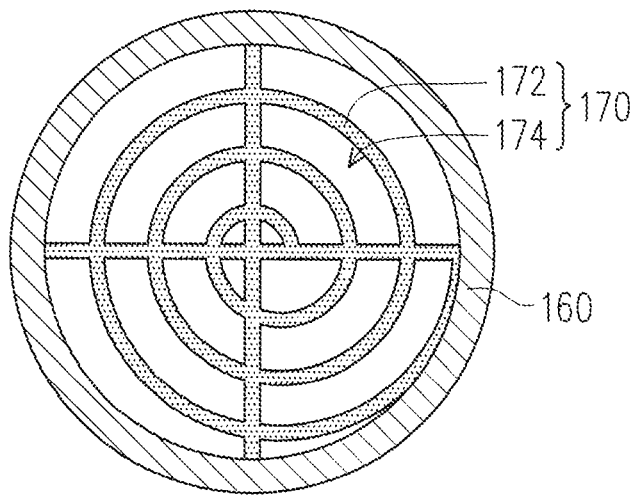
Figure 4D:
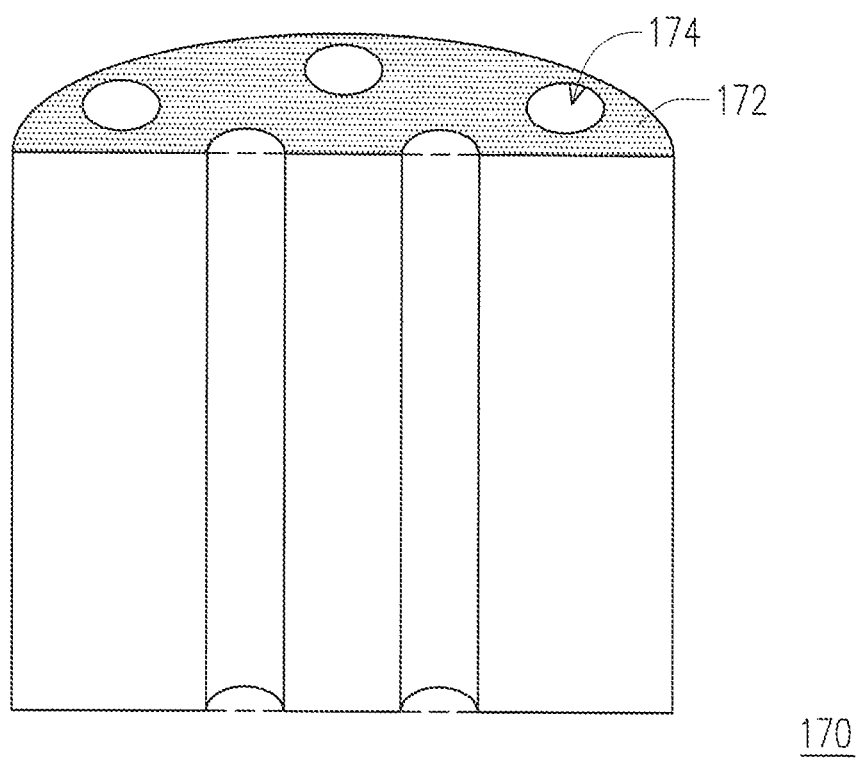
FIG. 4D to FIG. 4E are respectively cross sections of a heating component in an evaporation apparatus according to an embodiment of the disclosure.
Figure 4E:
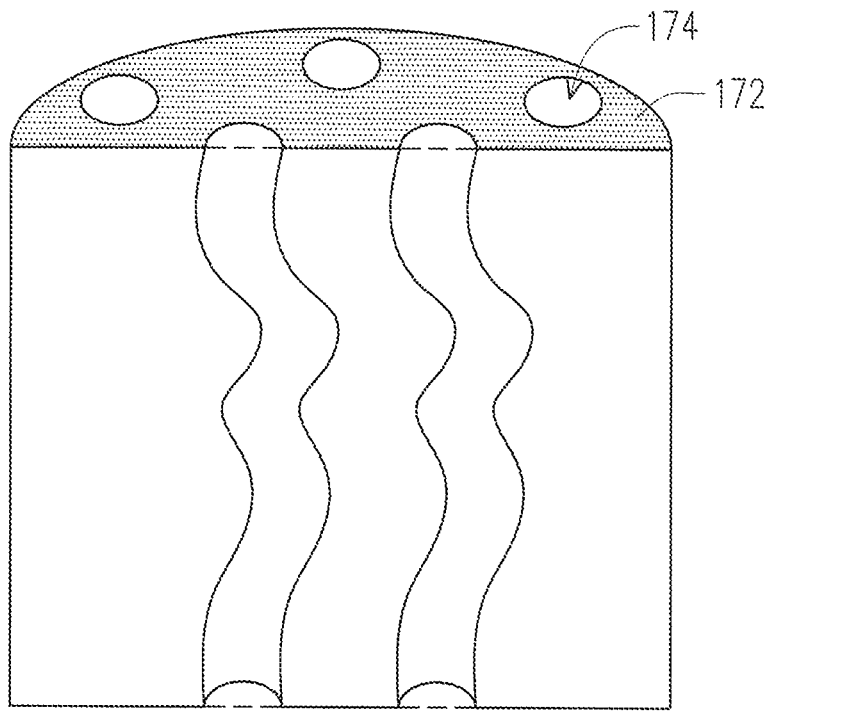

In the present embodiment, the heating component 170 is disposed in at least a portion of the passageway 160 and configured to heat the deposition material 110a. In other words, the heating component 170 is, for instance, disposed in the L-shaped tube 112 and/or the transfer tube 122. The heating component 170 is suitable for increasing the surface contact area of the L-shaped tube 112 and/or the transfer tube 122 such that the L-shaped tube 112 and/or the transfer tube 122 overall have/has a uniform temperature to provide a high heat conduction path or increase the collision probability of the deposition material and the heating component 170. As a result, the vaporized deposition material 110a flowing through the L-shaped tube 112 and/or the transfer tube 122 can be evenly heated. In the present embodiment, the heating component 170 is, for instance, a mesh structure, and the material thereof can be a conductive material, for instance. As shown in FIG. 3A and FIG. 3B, the heating component 170 includes, for instance, a body 172 and a plurality of openings 174 disposed in the body 172. The body 172 includes, for instance, a plurality of fins in a crisscrossed arrangement, and the openings 174 are spaces formed between adjacent fins. In the present embodiment, the shape of the openings 174 is a square as an example, but the disclosure is not limited thereto. In other embodiments, the openings 174 can also be regular polygons (such as regular hexagon) in addition to circles and squares, irregular shapes, or a combination thereof. Moreover, in an embodiment, as shown in FIG. 4A, in the heating component 170, the body 172 is, for instance, filled in the passageway 160, and a plurality of openings 174 passing through the body 172 is formed in the body 172. Moreover, in another embodiment, as shown in FIG. 4B, the body 172 substantially includes a plurality of concentric cylindrical tubes, and the openings 174 are formed between the concentric cylindrical tubes. In yet another embodiment, as shown in FIG. 4C, the body 172 substantially includes a spiral tube, and the openings 174 is formed between the spiral tubes. Of course, the disclosure is not limited thereto, and in other embodiments, the heating component 170 can also have other configurations, such as a thermal conduction plate. Moreover, in the case of the openings 174 of FIG. 4A, the openings 174 can be straight tubes (as shown in FIG. 4D), bent tubes (as shown in FIG. 4E), or a combination thereof, wherein the bent tubes can further increase the collision probability of the deposition material and the heating component 170. Similarly, the openings 174 of the body 172 in FIG. 4B and FIG. 4C or other embodiments can also be the straight tubes, bent tubes, or a combination thereof.

In the present embodiment, the chamber 130 includes a manifold 132, a quartz crystal microbalance (QCM) 134, and a pressure sensor 136. The manifold 132 is connected to the valve 120 and has at least one first nozzle 132a and at least one second nozzle 132b. The valve 120 is connected to the manifold 132 via the transfer tube 122. In the present embodiment, a plurality of the first nozzle 132a and one of the second nozzle 132b are used. However, the disclosure is not limited thereto, and the number of the first nozzle 132a and the number of the second nozzle 132b can be adjusted based on user demand. In the present embodiment, the first nozzle 132a and the second nozzle 132b are disposed at different sides of the manifold 132. The quartz crystal microbalance 134 and the second nozzle 132b are disposed opposite to each other. The deposition material 110a is suitable to be deposited on the quartz crystal microbalance 134 via the second nozzle 132b, and the quartz crystal microbalance 134 includes a shutter 134a facing the second nozzle 132b. However, the disclosure is not limited thereto. In other embodiments, if needed, the first nozzle 132a and the second nozzle 132b can also be located on the same side of the manifold 132. Moreover, in other embodiments, the quartz crystal microbalance 134 and the pressure sensor 136 can be omitted.

In the present embodiment, the evaporation apparatus 100 includes a shutter controller 140. The shutter controller 140 is configured to control the open and close of the shutter 134a on the quartz crystal microbalance 134. Moreover, the evaporation apparatus 100 includes a support 150 configured to support the quartz crystal microbalance 134. The support 150 is configured to adjust the position of the quartz crystal microbalance 134 opposite to the second nozzle 132b. In the present embodiment, the support 150 adjusts the position of the quartz crystal microbalance 134 in the x direction. However, the disclosure is not limited thereto, and the support 150 can also adjust the position of the quartz crystal microbalance 134 in the y direction or z direction based on user needs.

In the present embodiment, referring to FIG. 2, when the evaporation apparatus 100 is performing an evaporation process, the chamber 130 further includes a target 138. The target 138 is disposed opposite to the first nozzle 132a. As shown in FIG. 2, the deposition material 110a is deposited on the target 138 via the first nozzle 132a during the deposition process. Also as shown in FIG. 2, when monitoring the deposition process, the deposition material 110a is deposited on the quartz crystal microbalance 134. The target 138 is, for instance, a substrate on which the deposition material 110a is deposited. In other embodiments, during the deposition process, the target 138 may be not disposed in the chamber 130. In the present embodiment, during the deposition process, the target 138 is disposed in the chamber 130 to perform deposition on the target 138. However, the disclosure is not limited thereto. The target 138 can be a structure suitable for housing a substrate so as to perform deposition on the substrate, and the target 138 can be located in the chamber 130 even when a deposition process is not performed. The structure and configuration of the target 138 can be decided based on user needs.

In the present embodiment, the chamber 130 can be a vacuum chamber. During the deposition process, a deposition process is executed in the vacuum chamber 130. Moreover, the pressure in the manifold 132 is substantially the same as the pressure at the target 138 in the vacuum chamber 130. As a result, the pressure sensor 136 detecting the pressure in the manifold 132 essentially detects the same pressure at the target 138. Therefore, the result from the pressure sensor 136 can be used to calculate the film thickness and deposition rate of the deposition material 110a. Moreover, the valve 120 and the material source 110 are disposed outside the chamber 130. However, in other embodiments, the valve 120 and the material source 110 can be connected to the chamber 130 such that the insides of the valve 120 and the materials source 110 are partially vacuum.

Figure 5:
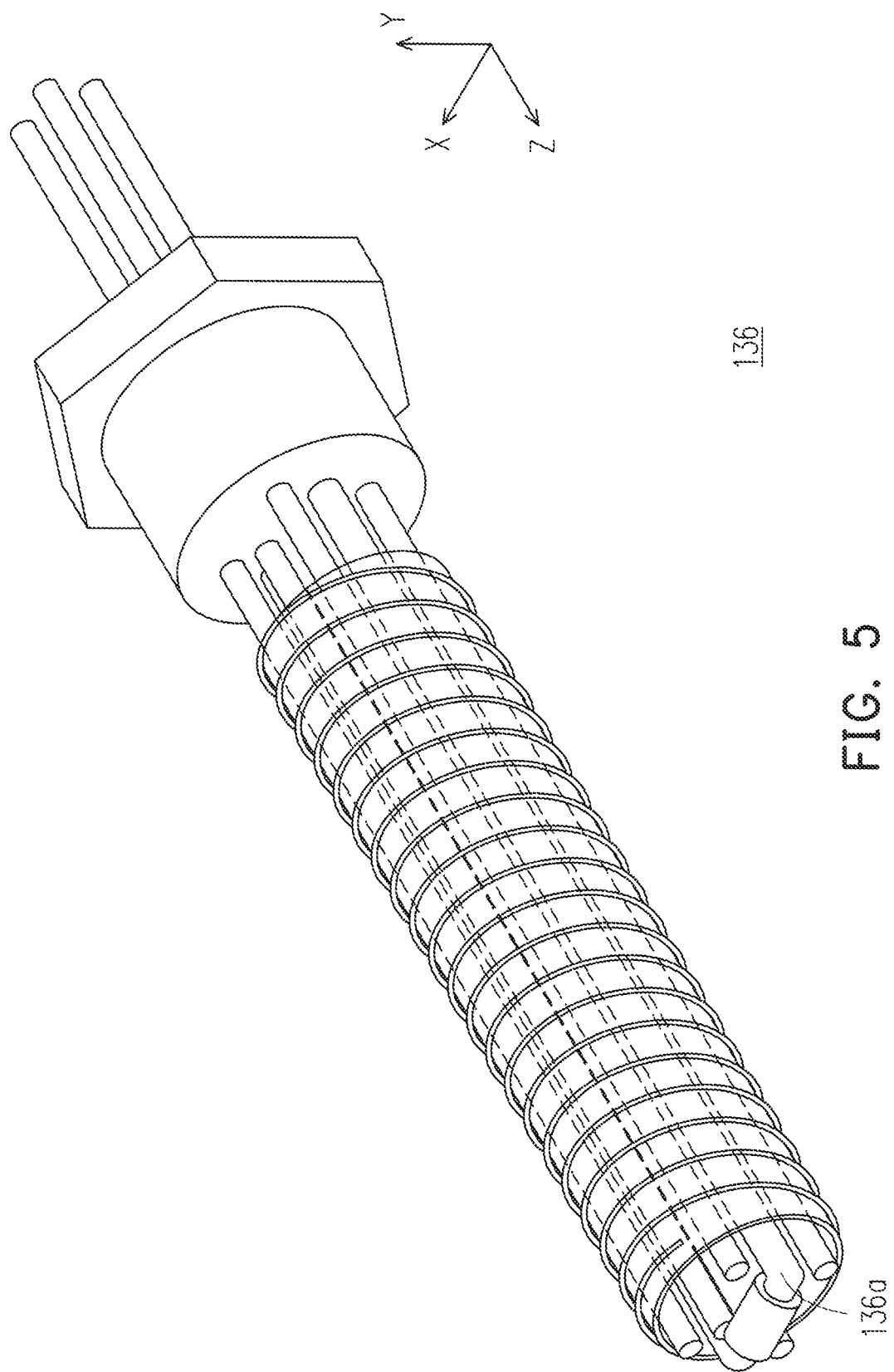
FIG. 5 is a schematic of a pressure sensor in an evaporation apparatus according to an embodiment of the disclosure.

FIG. 5 is a schematic of a pressure sensor in an evaporation apparatus according to an embodiment of the disclosure. In the present embodiment, the pressure sensor 136 is disposed in the manifold 132. The pressure sensor 136 includes a filament 136a. The pressure sensor 136 is, for instance, a Pirani gauge. In other words, the pressure sensor 136 includes the filament 136a to measure the pressure of the manifold 132. In the present embodiment, the filament 136a is a metal. For instance, the filament 136a is platinum. However, the metal of the filament 136a can be any suitable metal. Moreover, the present embodiment shows two filaments 136a, but the number of the filament can be a plurality based on user need.

In the present embodiment, to measure the pressure of the manifold 132, the heated filament 136a in the pressure sensor 136 is suspended in the manifold. In other words, the filament 136a is disposed in the manifold 132 to be in contact with the vaporized deposition material 110a in the manifold 132. In the present embodiment, a portion of the pressure sensor 136 is disposed outside the manifold 132. In other embodiments, the entire pressure sensor 136 is disposed inside the manifold 132. When the gas molecules of the vaporized deposition material 110a are collided with the filament 136a, the filament 136a loses heat to the gas. If the pressure is reduced, then the number of molecules present is proportionally reduced, and the filament 136a loses heat more slowly, and vice versa. The measurement of heat loss is an indirect indicator of pressure. Moreover, since the manifold 132 is in the vacuum chamber 130, the pressure in the manifold 132 of the vaporized deposition material 110a is substantially the same as the pressure of the vaporized deposition material 110a at the target 138. Therefore, by measuring the pressure of the manifold 132, the deposition rate of the deposition material 110a on the target 138 can be confirmed.

In the present embodiment, the evaporation apparatus 100 includes a quartz crystal microbalance 134, and the quartz crystal microbalance 134 can also measure the deposition rate of the deposition material 110a on the target 138. The quartz crystal microbalance 134 measures the mass variation of each unit area by measuring the frequency variation of a quartz crystal resonator. An increase or reduction of small mass caused by oxide growth/decay or film deposition at the surface of an acoustic resonator interferes with resonance. Therefore, the quartz crystal microbalance 134 can detect the deposition rate of the deposition material 110a on the target 138. Frequency measurement is also readily performed with high precision. However, the quartz crystal microbalance 134 has a relatively short sensor life, and therefore the evaporation apparatus 100 is not entirely dependent on the quartz crystal microbalance 134 for measuring the deposition rate of the deposition material 110a.

In the present embodiment, the pressure sensor 136 and the quartz crystal microbalance 134 can both measure the deposition rate of the deposition material 110a, and the pressure sensor 136 is calibrated to measure the same deposition rate as the deposition rate measured by the quartz crystal microbalance 134. Once the pressure sensor 136 is calibrated, the shutter 134a on the quartz crystal microbalance 134 is closed, such that the deposition material 110a is no longer deposited on the quartz crystal microbalance 134. Next, the evaporation apparatus 100 continues to measure the deposition rate according to the pressure sensor 136. As a result, since the deposition material 110a is not continuously deposited on the quartz crystal microbalance 134, the quartz crystal microbalance 134 can have a longer life. Since the shutter 134a on the quartz crystal microbalance 134 is closed once the quartz crystal microbalance 134 calibrates the pressure sensor 136, the quartz crystal microbalance 134 can still be used for a longer period of time even during a deposition process with a high deposition rate.

In the present embodiment, since the filament is heated and has a higher temperature than that of the vaporized deposition material 110a, the deposition material 110a is not deposited on the filament 136a, and therefore the pressure sensor 136 has a longer life. However, if the parameters are changed (such as temperature), the deposition rate measured by the pressure sensor 136 may become inaccurate, and the pressure sensor 136 needs to be calibrated again by the quartz crystal microbalance 134. Via the pressure sensor 136 and the quartz crystal microbalance 134, the evaporation apparatus 100 can accurately measure the deposition rate and have a longer life. The quartz crystal microbalance 134 has a longer life and does not need to be changed frequently, and therefore costs are reduced. Moreover, by using both the quartz crystal microbalance 134 and the pressure sensor 136, the evaporation apparatus 100 can continuously monitor the film thickness and deposition rate of the deposition material 110a on the target 138. Since the pressure sensor 136 is mainly used as the main sensor to monitor the film thickness and deposition rate of the deposition material 110a on the target 138, the evaporation apparatus 100 is suitable for a deposition process with high deposition rate. The quartz crystal microbalance 134 is configured to calibrate the pressure sensor 136, and therefore the quartz crystal microbalance 134 can still have a longer life in a deposition process with high deposition rate. For instance, the evaporation apparatus 100 is suitable for application in a deposition process of an organic LED tube requiring high deposition rate. Of course, the evaporation apparatus 100 can also be applied in other deposition processes with low deposition rates.

Figure 6:
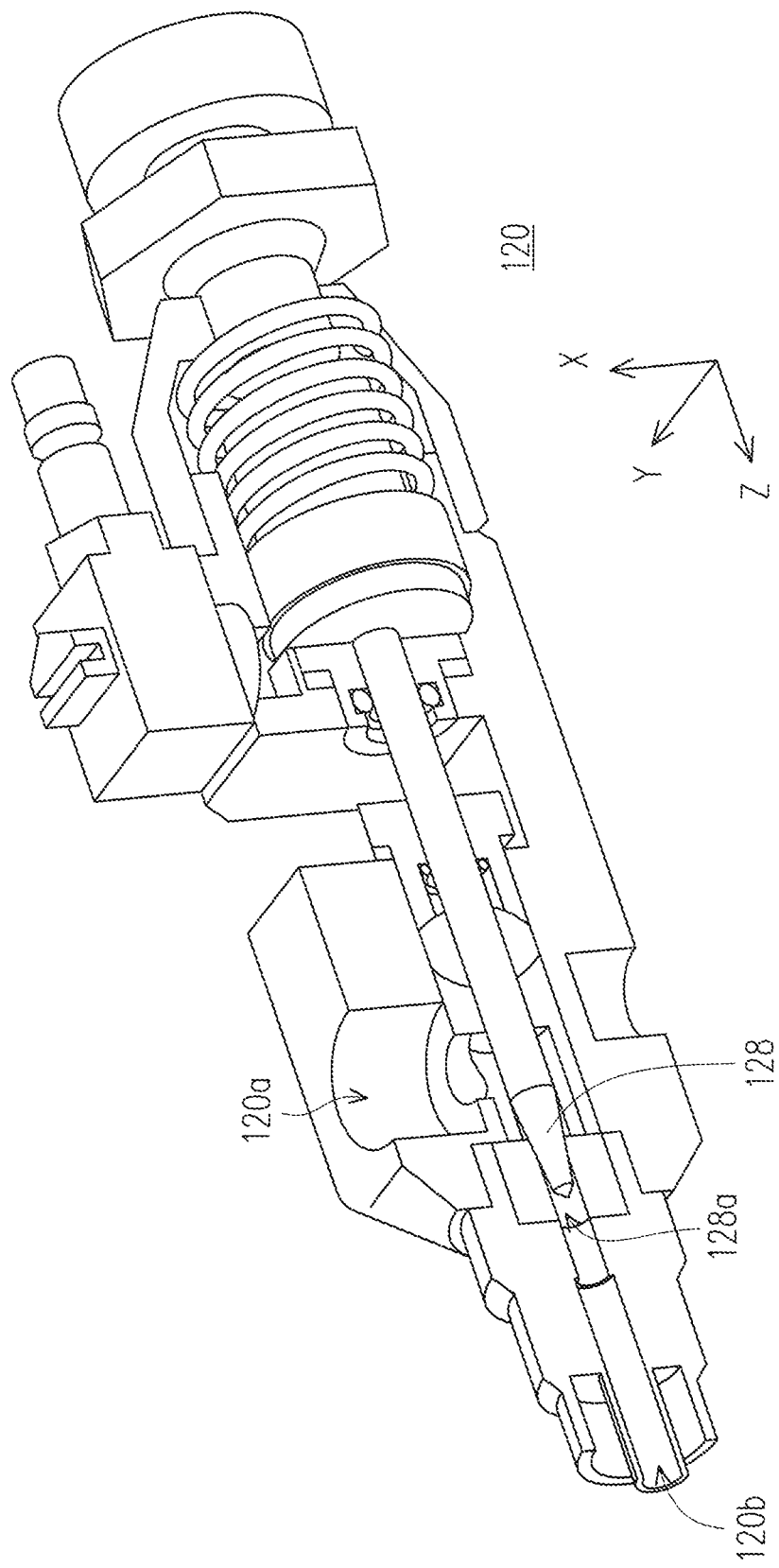
FIG. 6 is a 3D view of a cross section of a valve in an evaporation apparatus according to an embodiment of the disclosure.

FIG. 6 is a 3D view of a cross section of a valve in an evaporation apparatus according to an embodiment of the disclosure. Referring to FIG. 6, the valve 120 includes a first opening 120a and a second opening 120b. The first opening 120a is communicated with the material source 110 via the L-shaped tube 112. The second opening 120b is communicated with the manifold 132 via the transfer tube 122. In the present embodiment, the valve 120 is a needle valve. The valve 120 further includes a needle 128 and a third opening 128a. The needle 128 is configured to move back and forth relative to the third opening 128a via the valve controller 124. In the present embodiment, as shown in FIG. 6, the needle 128 is configured to move back and forth in the z direction. The needle 128 has an inclined plane toward the third opening 128a, and therefore when the position of the needle 128 is changed relative to the third opening 128a, the size of the third opening 128a is changed. As a result, the valve controller 124 controls the position of the needle 128 to adjust the size of the third opening 128a. When the needle 128 is pushed into the third opening 128a as much as possible, the needle 128 blocks the third opening 128a to prevent any fluid from passing through so as to close the third opening 128a. When the needle 128 is moved away from the third opening 128a such that a space is present between the needle 128 and the wall to form the third opening 128a, the fluid can pass through the third opening 128a. Since the needle 128 has an inclined plane, the size of the opening 128a is adjusted by the back and forth movement of the needle 128 relative to the third opening 128a in the z direction. If the needle 128 is moved back as much as possible such that the third opening 128a is minimally blocked by the needle 128, then the third opening 128a can be regarded as completely open. By adjusting the size of the third opening 128a via the needle 128, the flow of the deposition material 110a passing through the valve 120 can be controlled. In other embodiments, the valve 120 is not a needle valve, but is any other suitable valves. In other words, in other embodiments, other valves that can control and adjust the flow of the passing deposition material 110a can also be used. Moreover, in other embodiments, a valve that does not control and adjust the flow of the deposition material 110a can be used.

In an embodiment (not shown), to evenly heat the deposition material 110a and maintain the desired temperature, a heating apparatus can be further disposed at a case 126 outside the valve 120, the needle 128 of the valve 120, the cover 129 of the valve 120, or the manifold 132 or keep the components at the desired temperature.

In the present embodiment, the evaporation apparatus 100 is a manufacturing executing system (MES). The MES is computerized to track the process and to allow components in the evaporation apparatus 100 to automatically control the entire process. The MES controls the shutter controller 140 and the valve controller 124 to achieve accurate monitor results and the desired deposition rate. Moreover, the MES controls the vaporization temperature of the material source 110 via the heater 114 based on user needs, and a desired even temperature is provided to the vaporized deposition material 110a via the heating component 170. By adjusting the vaporization temperature of the material source 110 and stabilizing the temperature of the vaporized deposition material 110a, the rate that the vaporized deposition material 110a flows and passes through the valve 120 is changed to change the deposition rate of the deposition material 110a. Moreover, the MES determines if the results are read from the pressure sensor 136 or from the quartz crystal microbalance 134 for the thickness reference of the deposition material 110a on the target 138. Therefore, since the entire process is automated, the MES allows the evaporation apparatus 100 to accurately and continuously perform a deposition process.

Figure 7:
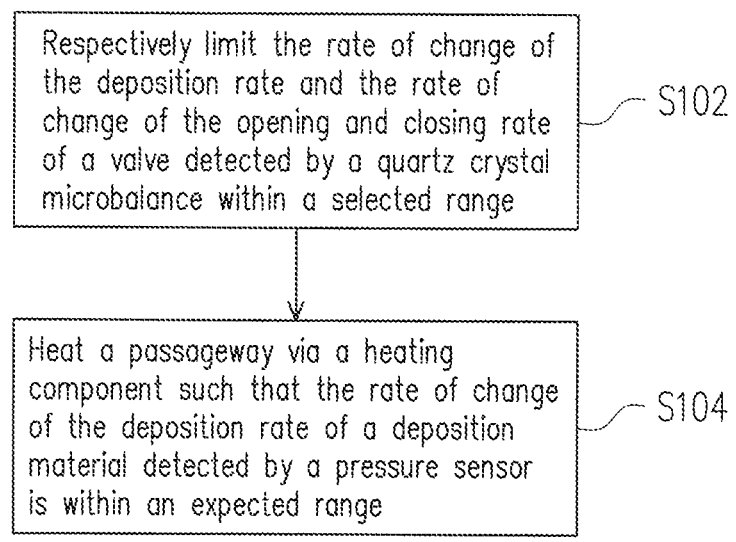
FIG. 7 is a flow chart of a calibration method of an evaporation apparatus according to an embodiment of the disclosure.

FIG. 7 is a flow chart of a calibration method of an evaporation apparatus according to an embodiment of the disclosure. The method is, for instance, suitable for changing the type of the deposition material or changing the deposition rate of the deposition material and the initial calibration of the film thickness, and includes the following steps. The deposition material 110a is deposited on the target 138 via the first nozzle 132a of the manifold 132, and the deposition material 110a is deposited on the quartz crystal microbalance 134 via the second nozzle 132b of the manifold 132. Before the step, the deposition material 110a in the material source 110 is vaporized. Moreover, the valve 120 connected to the material source 110 and the manifold 132 is opened such that the vaporized deposition material 110a passes through the valve 120 via the L-shaped tube 112 and enters the manifold 132. In particular, the opening and closing rate of the valve 120 controls the rate of the vaporized deposition material 110a entering the manifold 132, such that the deposition rate and film thickness of the deposition material 110a are affected. At this point, the evaporation apparatus 100 reads data from the valve controller 124 as reference for the opening and closing rate measurement of the valve 120.

Next, the deposition rate and film thickness of the deposition material 110a on the target 138 are measured via the quartz crystal microbalance 134. The shutter 134a is opened, and the deposition material 110a is deposited on the quartz crystal microbalance 134. By depositing the deposition material 110a on the quartz crystal microbalance 134, the quartz crystal microbalance 134 can measure the deposition rate and film thickness of the deposition material 110a on the target 138. At this point, the evaporation apparatus 100 reads data from the quartz crystal microbalance 134 as reference for the film thickness and deposition rate measurements.

Next, the rate of change of the deposition rate of the deposition material 110a and the rate of change of the opening and closing rate of the valve 120 detected by the quartz crystal microbalance 134 are respectively limited within a selected range (step S102). In the present embodiment, the rate of change of the deposition rate detected by the quartz crystal microbalance 134 is, for instance, less than 2%, and the rate of change of the opening and closing rate of the valve 120 is, for instance, between 30% and 35%.

Next, the passageway 160 is heated via the heating component 170 such that the rate of change of the deposition rate of the deposition material 110a detected by the pressure sensor 136 is within an expected range (step S104). By controlling, for instance, the temperature and heating rate of the heating component 170, the vaporized deposition material 110a has an even temperature, and then the deposition rate of the deposition material 110a is adjusted such that the rate of change of the deposition rate of the deposition material 110a detected by the pressure sensor 136 is within an expected range. The pressure sensor 136 measures the pressure in the manifold 132, and the pressure is substantially the same as the pressure at the target 138. The data from the pressure sensor 136 can confirm the deposition rate and film thickness of the deposition material 110a on the target 138. In the present embodiment, the expected range of the rate of change of the deposition rate of the deposition material 110a is less than 2%. After the initial calibration, the deposition material can be deposited at a deposition rate with high accuracy and high stability, wherein the degree of unevenness of the film thickness is, for instance, less than 3%. In the present embodiment, the heating component 170 can allow the vaporized deposition material 110a to have a uniform internal energy, and therefore the adaptability of the pressure sensor 136 to various deposition materials can be increased to achieve high stability of the coating.

Once the pressure sensor 136 is calibrated, the shutter 134a on the quartz crystal microbalance 134 is closed, such that the deposition material 110a is no longer deposited on the quartz crystal microbalance 134. Next, if the deposition rate measured by the sensor 136 is inaccurate, then the pressure sensor 136 needs to be calibrated again by the quartz crystal microbalance 134.

Based on the above, the evaporation apparatus of the disclosure includes a heating component disposed in the passageway, and therefore the evaporation apparatus is an apparatus with uniform thermal energy. Therefore, when the pressure sensor and the valve controller are used together, the production demands of high accuracy and high stability of the coating rate required in a continuous evaporation process with roll-to-roll high-coating rate.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An evaporation apparatus, comprising:
    a material source configured to provide a deposition material;
    a chamber comprising a manifold;
    a passageway configured to be connected to the material source and the manifold;
    a heating component disposed in at least a portion of the passageway and configured to heat the deposition material;

a valve, coupled between the material source and the chamber, controlling a flow of the deposition material into the chamber;

a quartz crystal microbalance, disposed in the chamber, measuring a deposition rate of the deposition material and an opening and closing rate of the valve;

a pressure sensor, measuring a pressure in the manifold to detect a deposition rate of the deposition material passing through the manifold, wherein the evaporation apparatus respectively limits a rate of change of the deposition rate of the deposition material and a rate of change of the opening and closing rate of the valve detected by the quartz crystal microbalance within a selected range; and the evaporation apparatus heats the passageway via the heating component to control a rate of change of a deposition rate of the deposition material detected by the pressure sensor within an expected range.

2. The evaporation apparatus of claim 1, wherein the heating component comprises a mesh structure.

3. The evaporation apparatus of claim 2, wherein the mesh structure comprises a body and a plurality of openings disposed in the body.

4. The evaporation apparatus of claim 3, wherein a shape of the openings comprises a circle, a regular polygon, an irregular shape or a combination thereof.

5. The evaporation apparatus of claim 3, wherein the body comprises a plurality of fins in a crisscrossed arrangement.

6. The evaporation apparatus of claim 3, wherein the body comprises a plurality of concentric cylindrical tubes.

7. The evaporation apparatus of claim 3, wherein the body comprises a spiral tube.

8. The evaporation apparatus of claim 1, wherein the passageway comprises an L-shaped tube and a transfer tube, the L-shaped tube is connected to the material source and the valve, the transfer tube is connected to the valve and the manifold, and the heating component is disposed in at least one of the L-shaped tube and the transfer tube.

9. The evaporation apparatus of claim 1, further comprising a heater adjacent to the material source and configured to heat the material source.

10. The evaporation apparatus of claim 1, wherein the manifold has at least one first nozzle and at least one second nozzle.

11. The evaporation apparatus of claim 10, wherein the quartz crystal microbalance is disposed opposite to the at least one second nozzle, the deposition material is configured to be deposited on the quartz crystal microbalance via the at least one second nozzle, and the quartz crystal microbalance comprises a shutter facing the at least one second nozzle.

12. The evaporation apparatus of claim 10, wherein the chamber further comprises a target disposed opposite to the at least one first nozzle, and the deposition material is configured to be deposited on the target via the at least one first nozzle.

13. The evaporation apparatus of claim 10, wherein a pressure of the manifold is substantially the same as a pressure at the target in the chamber.

14. The evaporation apparatus of claim 11, further comprising a shutter controller configured to control an open and close of the shutter on the quartz crystal microbalance.

15. A calibration method of an evaporation apparatus, wherein the evaporation apparatus includes a material source, a chamber with a manifold, a passageway coupled between the material source and the manifold, a heating component disposed within at least a portion of the passageway, a valve coupled between the material source and the chamber, a quartz crystal microbalance disposed in the chamber and a pressure sensor disposed in the manifold, wherein the calibration method comprising:

providing a deposition material to the manifold from the material source through the passageway;

heating the deposition material;

respectively limiting a rate of change of a deposition rate of the deposition material and a rate of change of an opening and closing rate of the valve detected by the quartz crystal microbalance within a selected range; and heating the passageway via the heating component such that a rate of change of a deposition rate of the deposition material detected by the pressure sensor is within an expected range.

16. The calibration method of claim 15, wherein the rate of change of the deposition rate of the deposition material detected by the quartz crystal microbalance is less than 2%.

17. The calibration method of claim 15, wherein the rate of change of the opening and closing rate of the valve is between 30% and 35%.

18. The calibration method of claim 15, wherein the expected range is less than 2%.

* * * * *